(12) United States Patent
Mazlout et al.

(10) Patent No.: US 6,611,418 B2
(45) Date of Patent: Aug. 26, 2003

(54) COMPLIANT COLLET CHUCK

(75) Inventors: Lazhar Mazlout, Duluth, GA (US); Peter M. Mueller, Suwanee, GA (US); Anthony D. Parker, Lawrenceville, GA (US)

(73) Assignee: Fitel USA Corp., Norcross, GA (US)

( * ) Notice: Subject to any disclaimer, the term of this patent is extended or adjusted under 35 U.S.C. 154(b) by 26 days.

(21) Appl. No.: 10/008,396

(22) Filed: Dec. 6, 2001

(65) Prior Publication Data

US 2003/0107864 A1 Jun. 12, 2003

(51) Int. Cl.⁷ .............................................. H01T 23/00
(52) U.S. Cl. ...................................................... 361/234
(58) Field of Search ........................ 361/234; 279/128; 228/195, 209

(56) References Cited

U.S. PATENT DOCUMENTS

| | | | |
|---|---|---|---|
| 4,217,027 A | 8/1980 | MacChesney | 350/96.3 |
| 5,607,541 A | * 3/1997 | Kubota et al. | 361/234 |
| 6,115,232 A | * 9/2000 | Hass et al. | 361/234 |
| 6,571,581 B1 | 6/2003 | Mueller | 65/158 |

OTHER PUBLICATIONS

U.S. application Ser. No. 09/677,133 to Hollesen, et al.; filed Sep. 29, 2000, "Lubricated Glass Mold".

* cited by examiner

Primary Examiner—Edward H. Tso
Assistant Examiner—Pia Tibbits
(74) Attorney, Agent, or Firm—Thomas, Kayden, Horstemeyer & Risley, LLP (57) ABSTRACT

A compliant collet chuck for firmly clamping a workpiece has a base member attachable to the faceplate or spindle of a lathe. The base member has a central bore having a tapered portion and which is surrounding by a channel. A bayonet cylinder occupies the channel and has circumferential bayonet slots which receive eccentric locking pins therein. An adjustable collet chuck has a tapered portion at one end that bears against the tapered bore in the base member and a second tapered portion at the other end. An axial free play nut having a tapered bore, which is adapted to bear against the second taper, is threaded into the bayonet cylinder, and rotation thereof produces through the tapers, a radial force to compress the central bore of the chuck to grip the workpiece. Rotation of the actuating pins flexes the bayonet beam to lock the workpiece in place within the chuck.

20 Claims, 7 Drawing Sheets

COMPLIANT COLLET CHUCK

RELATED APPLICATIONS

This application is related to U.S. Pat. application Ser. No. 09/562,475 of Mueller, filed Aug. 31, 2000, and U.S. Ser. No. 09/077,133 of Hollesen et al., filed Sep. 29, 2000, the disclosures of which are incorporated by reference herein.

FIELD OF THE INVENTION

This present invention is directed to an apparatus for use in the productivity of optical fiber and more particularly, to a lathe collet chuck for use in the MCVD process.

BACKGROUND OF THE INVENTION

In the manufacture of optical fibers, a process known as MCVD (modified chemical vapor deposition) which is shown and described in U.S. Pat. No. 4,217,227 of J. B. MacChesney et al., which is incorporated herein by reference, is widely used and has become an industry standard for the production of glass pre-form tubes with the requisite chemicals deposited on the interior walls thereof. An initial step of the process involves injecting into an axially revolving glass tube mounted in a lathe chuck, which is referred to as a starter tube, a gaseous mixture containing certain reactants while the tube is being heated by a moving torch. The particle components of the gaseous mixture, i.e., the soot, are deposited on the interior walls of the tube in the region thereof of greatest heat, and, since the torch moves longitudinally, the soot is deposited along the length of the tube. After sufficient soot is deposited, the starter tube is heated and collapsed into a glass preform rod from which the optical fiber is subsequently drawn. During the deposition process, the remnant gases and reactants after the deposition process exhaust out of the end of the tube remote from the gas introduction end. It is not uncommon for a buildup of soot to occur at the exhaust end of the tube to the point where free flow of the mixture out of the tube is inhibited, which can have a deleterious effect on the deposition process. As a consequence, it is the usual practice to butt fuse an exhaust tube to the exhaust end of the starter tube, the exhaust tube having a larger internal diameter than the starter tube to permit free flow of the exhaust gas mixture from the starter tube into and through the exhaust tube. In order that the butt fusing produces a smooth joint, the butting ends of one or both tubes are shaped, such as a flare on the starter tube and/or a chamfer or taper on the exhaust tube prior to the deposition process. In U.S. patent application Ser. No. 09/562,476 of Mueller et al., filed Aug. 31, 2000, the disclosure of which is incorporated herein by reference, there is shown an apparatus for imparting the desired shape to the butting end of the two tubes, which involves mounting, gripping, and rotating the tubes being shaped in a lathe chuck.

Commonly, each tube is supported in the headstock shuck of common lathe bed, or in the headstock chuck and a tailstock chuck. The most widely accepted method of mounting a tube is to use a scroll chuck with the jaws of the chuck clamping the outside diameter of the tube, with the tube being cantilevered and having a free distal end. Other arrangements use collet chucks or other swaging devices to develop the clamping forces. In most, if not all, prior art arrangements, the generation of the clamping force is determined by the operator establishing a preload or through the use of springs or other force generating members.

In greater detail, existing systems utilize, for example, a three-jawed scroll chuck to provide the clamping. The chuck jaws and other components thereof are reasonably stout enough to be considered rigid bodies. Thus, when the clamping force is applied by rotation of the scroll, the glass starter tube (or exhaust tube) may be deformed slightly to have the resultant system retain clamping loads. Glass is a poor spring, hence any slight change in the scroll torque or temperature related expansion tends to relieve the clamping load very quickly. Some operators interpose a soft material between the chuck jaws and the glass tube to act as a buffer for the uneven loading and thermal expansion effects. The material and the clamping technique used have assumed the status of an "art" in achieving repeated and accurate results, where slipping tubes or cracked tubes are the penalty for improper clamping. Some degree of accuracy and repeatability can be achieved with the use of pneumatic chucks which involve an assembly of intricate movement linkages and piston drivers, all connected through complex rotary unions for the transmission of the clamping force energy. It is also possible to utilize geared preloaded chucks and electromagnetic clamping devices, with the concomitant problem of a complex arrangement of components. In all such cases, the complexity dictates a regimen of periodic maintenance and of even more often adjustment.

SUMMARY OF THE INVENTION

The present invention includes a compliant collet chuck that achieves repeatable and proper clamping forces and that is of simple construction and preforms the delicate gripping adjustment without requiring any particular skills of the operator.

In greater detail, the chuck of the invention, in a preferred embodiment thereof, comprises a collet base plate which is attachable to the spindle of the lathe and from which extends an upstanding portion. The base has a central bore surrounded by a channel, and has a tapered section or cone for receiving the adjustable collet chuck which has a rearend tapered portion that rides in the tapered cone of the base. There are, in this embodiment, three such collets that are spaced from each other and spring loaded, by springs in the spaces, with respect to each other. The collets are held together in a circular configuration having a central opening for the work piece by a circular spring member which surrounds them. With such a collet structure, as the collet assembly is moved toward the base member, the taper in the base bears against the taper at the rear of the collets and forces them radially inward, thereby applying a clamping force to a work piece in the central opening or bore.

A bayonet cylinder rides in the channel surrounding the tapered central bore of the base and has, at its inner or base end three circumferentially spaced circumferential bayonet slots into which radially disposed eccentric pins fit. The other end of the bayonet cylinder has internal threads for receiving an axially free play unit. The nut has external threads for mating with the threads of the cylinder, and a taper bore therein which bears against the tapered front portion of the three collets. Thus, as the nut is screwed into the cylinder, the collets are moved toward the base and the collets are moved radially inward by the taper in the base of the taper in the nut.

As pointed out hereinbefore, the end of the bayonet cylinder that rides in the channel, i.e., the proximal end, has three circumferentially spaced circumferential bayonet slots therein and the base has three radially disposed eccentric pins designed to fit within the slots in the bayonet locking arrangement. The eccentric pins, which, as will be seen hereinafter, function as cams, are equally spaced about the circumference of the bayonet cylinder and are mounted in the base, and extend into and through the channel perpendicularly in a single plane relative to the cylinder axis of rotation, which coincides with the axes of the tapered bore in the base and the tapered bore in the nut. Each cam is a shaft assembly having an eccentric section and having an exterior handle for rotating the cam. The camming surface is an eccentric surface ground smaller than the shaft diameter and tangent to the shaft diameter at a single point. Each of the bayonet slots in the bayonet cylinder has an arcuate seat for the camming portion of each pin, and the remainder of the slot, which is too narrow to accept the pin, defines a circumferential beam between the slot and the end of the cylinder. Thus, when the cylinder is inserted in the channel, each pin, upon rotation of the cylinder, comes to rest in its respective arcuate seat. Rotation of the pin causes camming pressure on the beam which acts to pull the cylinder further toward the base member, thereby adding an increment of tightening of the collets to the glass tube. The beam has a certain resilience which allows the arrangement to accommodate temperature changes in dimension of the glass tube.

In operation, the glass tube is mounted in the chuck and the nut is tightened to where the collets bear against the tube and to where any slack is removed. The eccentric or cam pins are then rotated to cam the bayonet cylinder down which causes the collets to grip the tube sufficiently for subsequent operations. The resilience of the beam allows for slight variations in tube diameter, whether as made or by thermal expansion.

In most instances, it is desirable that there be no rotation of the collets relative to the base member. This can be assured by means of an axial groove on one or more of the collets, and a mating pin in either the base or the bayonet cylinder. Such an arrangement allows axial movement of the collets but prohibits rotation thereof.

The chuck of the present invention affords proper tightening of the collets on the glass tube without reliance on the operator's guess as to the degree of tightening necessary, thereby eliminating to a large extent the possibility of damaged or shattered glass tubes. The principles and features of the present invention will be readily apparent from the following detailed description, read in conjunction with the accompanying drawings.

DETAILED DESCRIPTION

The present invention includes a compliant collet chuck for use on the lathe commonly used in the MCVD process, wherein the starter tube and the exhaust tube are cantilevered from their spindle chucks. The process of clamping the tubes is identical in both chucks used except for the diameter of the tubing to be clamped. In the following description, the arrangement for clamping only one of the tubes is discussed, with the understanding that the arrangement is the same for the other tube.

The existing prior art system utilizes a three-jawed scroll chuck to provide changing of the tube. Hence, when clamping forces are applied by rotating the scroll, the glass starter tube must be deformed slightly to have the system retain clamping loads during operation. However, glass is a poor spring and any slight change in scroll torque or thermal expansion tends to relieve the clamping load. The compliant chuck of the invention substantially eliminates this tendency toward relieving the clamping loads, as well as not requiring the operator to guess at the proper gripping load for the chuck.

Figure 1:
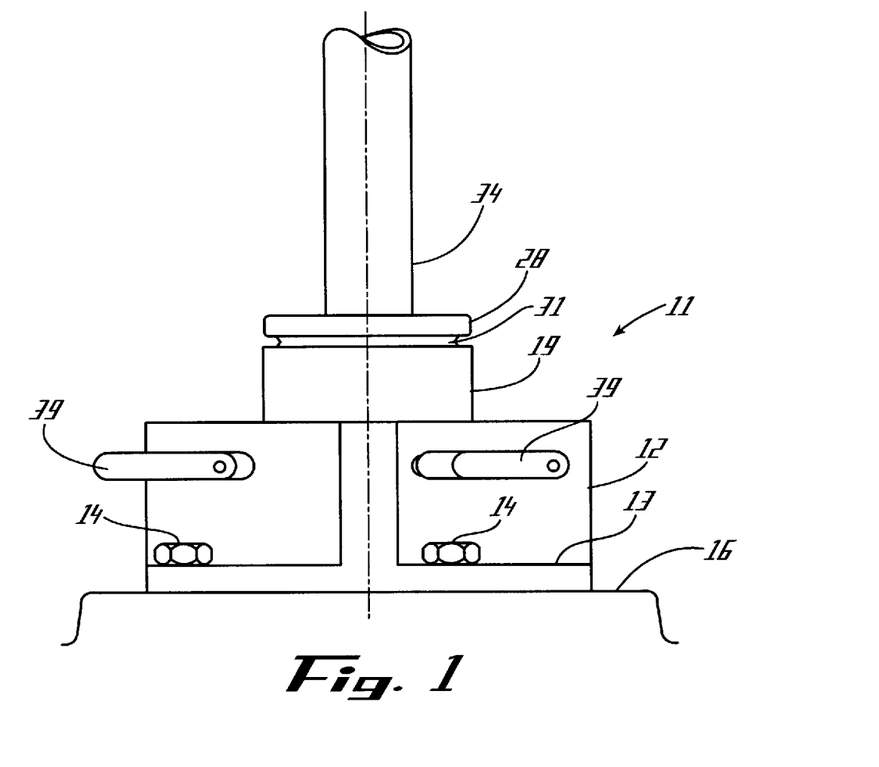
FIG. 1 is an elevation view of the compliant chuck of the invention.
Figure 2:
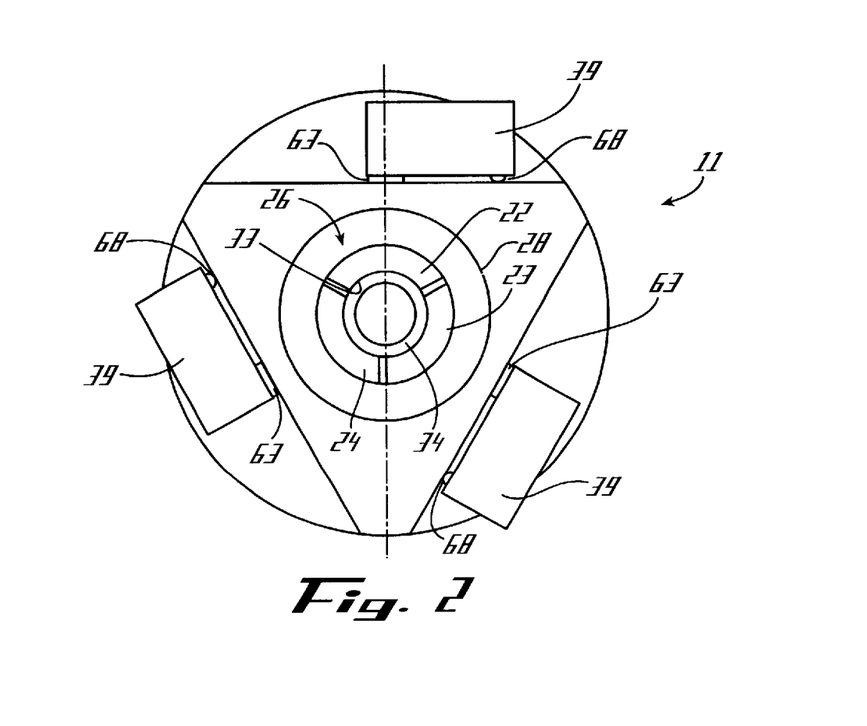
FIG. 2. is a plan view of the chuck of FIG. 1.
Figure 3:
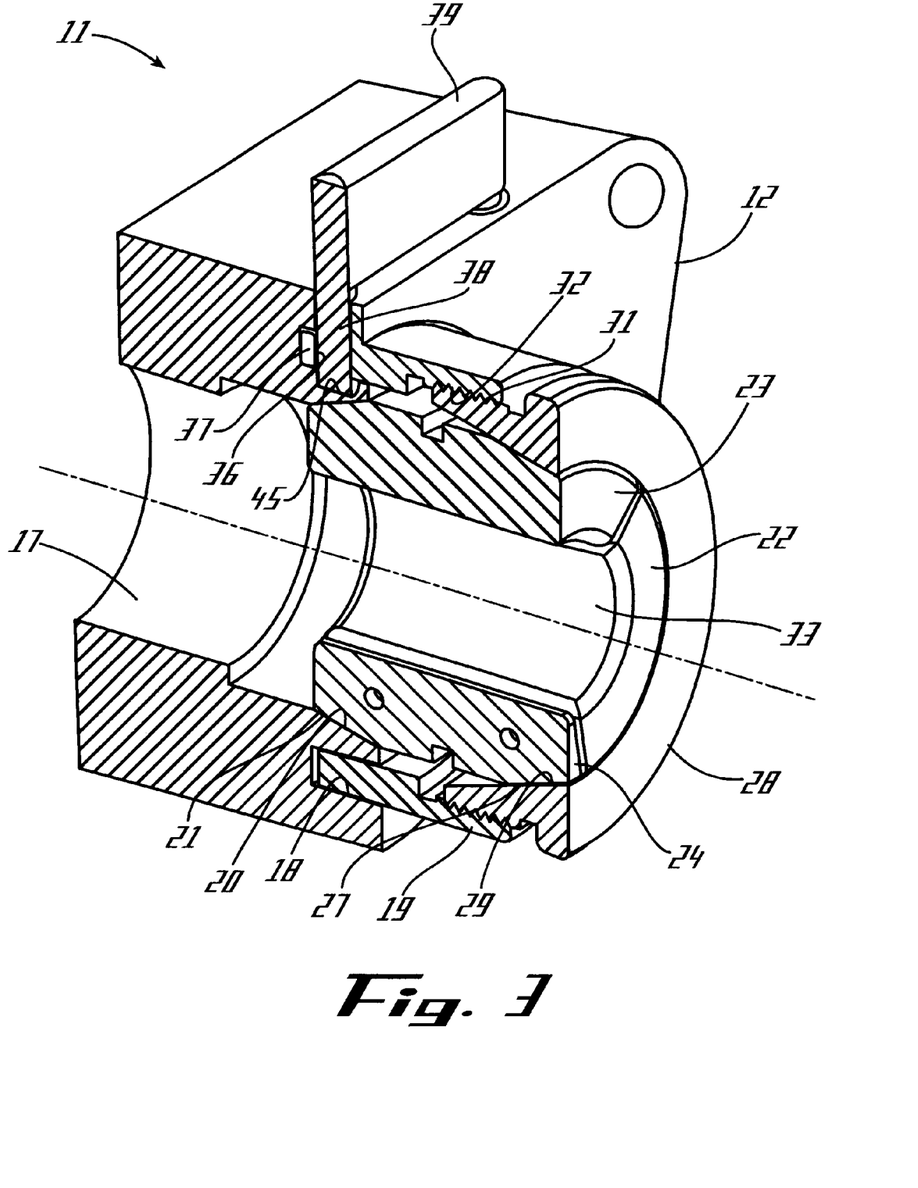
FIG. 3 is a perspective view, in partial cross-section, of the chuck of FIG. 1.

In FIGS. 1, 2, and 3, there is shown the compliant chuck 11 of the invention which comprises a base member 12 having a flange portion 13 attached by suitable means 14 (shown as hex head bolts) to the faceplate 16 of the lathe. As will be discussed in greater detail hereinafter, base member 12 has a central bore 17 and a surrounding channel 18 which has mounted therein a bayonet cylinder 19. Bore 17 has a tapered portion 20 therein, as best seen in FIG. 3, against which a corresponding tapered portion 21 of the collet jaws 22, 23, and 24 of a three collet jaw chuck 26 bear. Each of the collets jaws 22, 23, and 24 also has a tapered portion 27 at its distal end against which an axial free play nut 28 having an interior tapered bore 29 bears. Nut 28 has exterior threads 31 which mate with interior threads 32 in the distal end of bayonet cylinder 19. Thus, as will be discussed more fully hereinafter, when nut 28 is screwed into the threaded portion of bayonet cylinder 19, each of the collet jaws 22, 23, and 24 is forced against ramp or taper 22 while the tapered portion 29 of nut 28 is forced against ramp or taper 27 of the collect jaws. This pressure on the sloped, tapered, or ramped portions 20 and 27 of the collet jaws contracts the diameter of the gripping hole 33 to grip a tube 34 to be treated. Thus, an operator can mount the tube 34 in chuck 11 by turning nut 28 to tighten the grip of the collets on the tube 34. However, it is virtually impossible for the operator to exert sufficient turning force on the nut to cause the collets in turn to exert sufficient radial force on the tube 34 to damage it. As a consequence, the tube is held in place within the three jawed collet but not sufficiently firmly to withstand the forces encountered during operation of the lathe.

To insure sufficiently firm gripping of tube 34 under virtually all conditions, bayonet cylinder 19 has, adjacent its proximal end, three equally spaced circumferentially extending slots 36 which form resilient bearing members 37 and which are open to the bottom rims of cylinder 19. Within each slot is a detent groove 40 (not shown) for receiving a locking or actuating pin 38 which extends radially from outside the base member through the channel 18 at each slot location and is supported in a bushing 45 bored in the wall of base member 12. Each pin has an eccentric section within the channel 18, and has an external actuating arm 39 affixed thereto for rotating the pin 38. Rotation of the pin 38 causes the eccentric portion to cam the resilient beam member to apply an axial force pulling to the bayonet cylinder 19. As will be explained more fully hereinafter, this force converts to radial compressive forces throughout the system, to remove any play in the system and thus grip the tube 34 with unyielding firmness.

Figure 4:
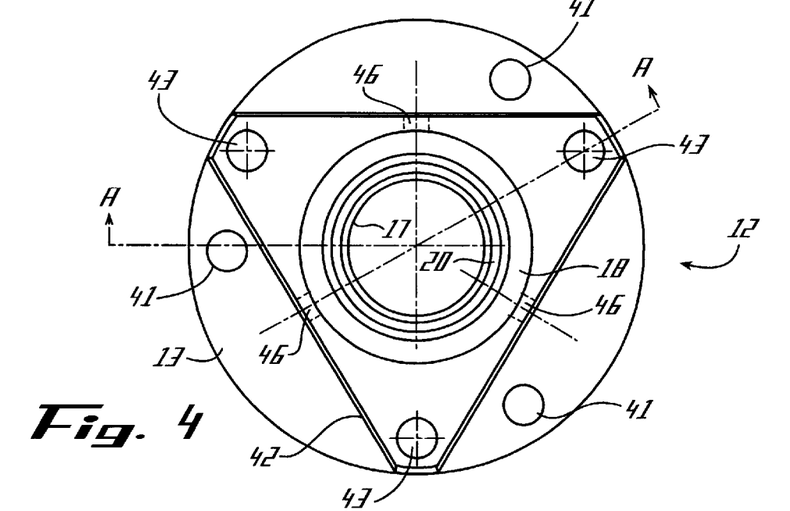
FIG. 4 is a plan view of the base member of the chuck of the invention.
Figure 5:
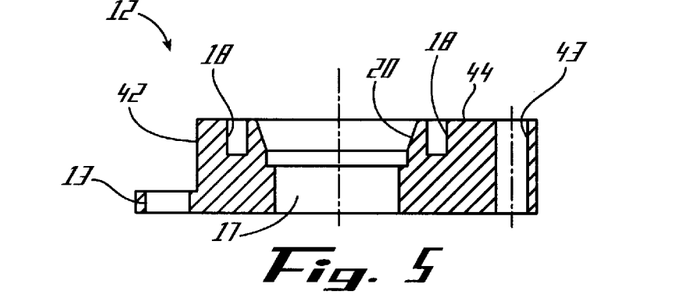
FIG. 5 is an elevation view, in cross-section, along the line A—A of FIG. 4.
Figure 6:
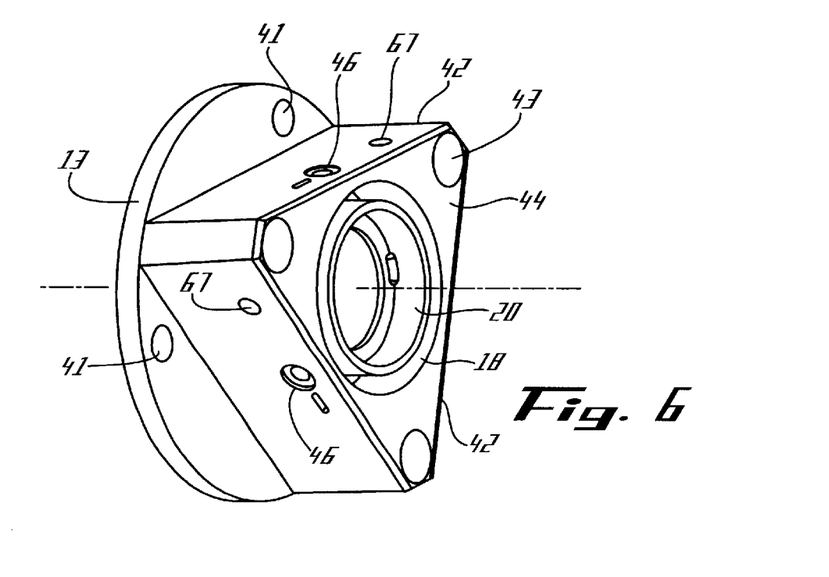
FIG. 6 is a perspective view of the base member of FIGS. 4 and 5.

The base member 12 is depicted in FIGS. 4, 5, and 6, and is made of a suitable metallic material such as, for example, aluminum. Base member 12 comprises a circular flange member 13 which has three mounting holes 41 bored therethrough for attaching base member 12 to the faceplate 16 of the lathe by any suitable means, such as bolts 14 (see FIG. 1). Extending from the front face of flange portion 13 and preferably integral therewith is a triangular block 42 which has, at its apices, bores 43 which aid in removing base member 12 from the faceplate 16 after cessation of operation. Centrally located in member 12 and extending therethrough is a bore 17 having tapered portion 20 extending from the top surface 44 of block 42. Surrounding the tapered portion 20 and extending partially through block 42 from top surface 44 is a circular channel 18, and, from approximately the midpoint of each side of triangular block 42 is a bore 46 which extends into channel 18, and which each receives a locking or actuating pin 38.

Figure 7:
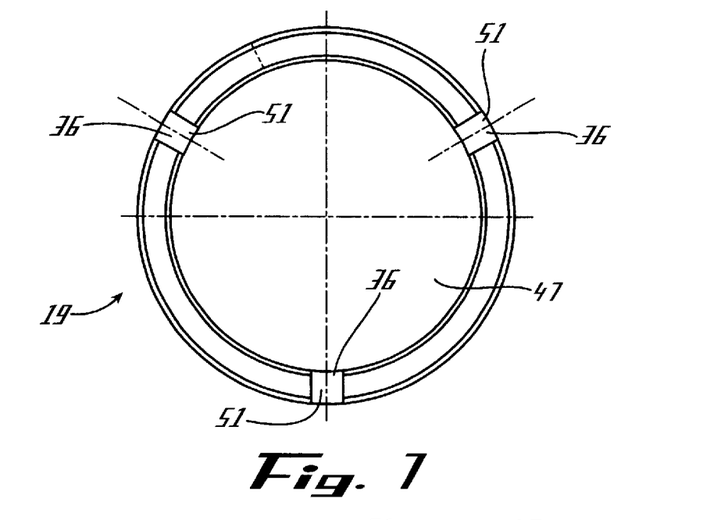
FIG. 7 is a plan view of the bayonet cylinder of the invention.
Figure 8:
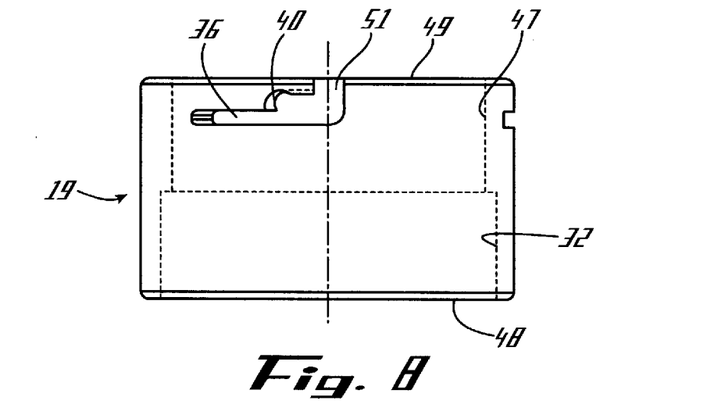
FIG. 8 is an elevation view of the bayonet cylinder of FIG. 7.
Figure 9:
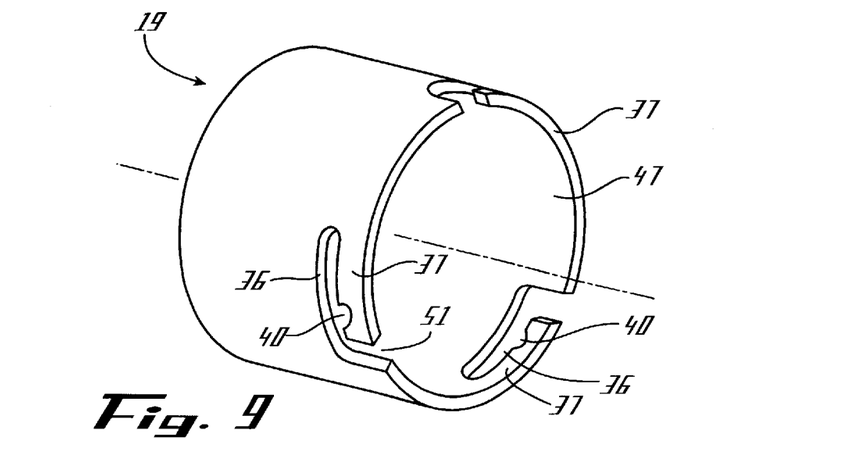
FIG. 9 is a perspective view of the cylinder of FIGS. 7 and 8.

The details of the bayonet cylinder 19 are shown in FIGS. 7, 8, and 9. Cylinder 19, which is preferably made of metallic material such as stainless steel, has a bore 47 extending therethrough from a distal end 48 to a proximal end 49. Approximately half of the length of bore 47 has interior threads 32 extending from the distal end 48 for receiving threaded free play nut 28, as shown in FIG. 3. Adjacent the proximal end 49 are three equally spaced circumferentially extending slots 36, each of which has an opening 51 at the proximal rim of cylinder 19 which is substantially normal to its corresponding slot 36, as shown. Each of the slots 36 has a detent groove 40 which is adapted to receive a locking or actuating pin 38, as will be explained more fully hereinafter. Each of the slots 36 creates a resilient beam 37 which, as will be explained more fully hereinafter, supplies the additional force necessary to create a positive grip on glass tube 34.

Figure 10:
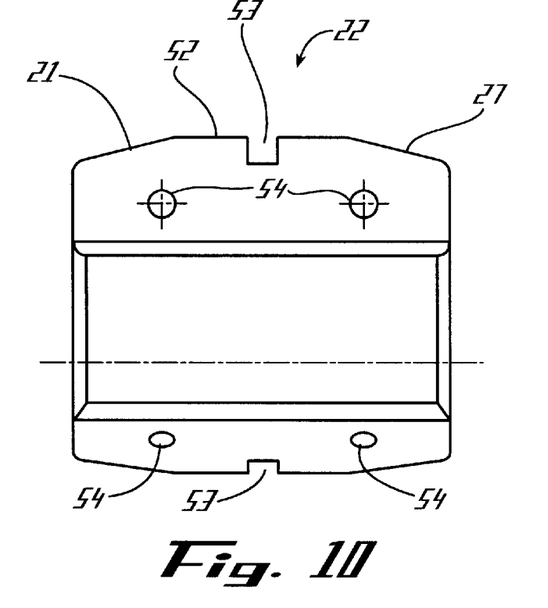
FIG. 10 is an elevation view of a collet jaw of the present invention.
Figure 11:
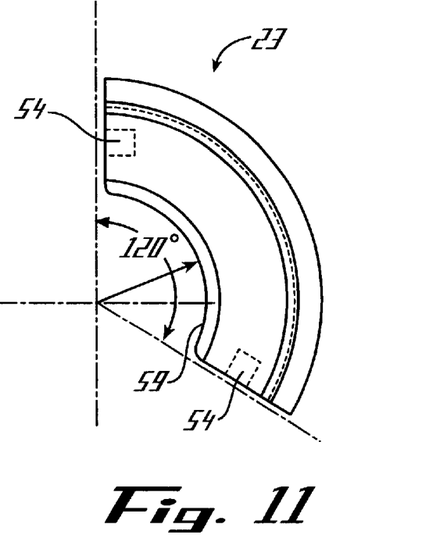
FIG. 11 is a plan view of the collet jaw of FIG. 10.
Figure 12:
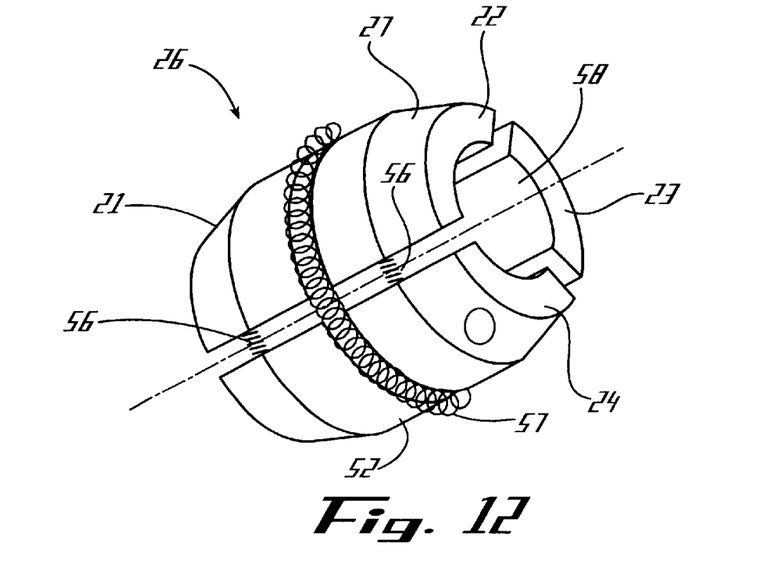
FIG. 12 is a perspective view of the three jawed collet of the present invention.

FIGS. 10 and 11 depict a single collet jaw 22, which is identical to collet jaws 23, and 24, and FIG. 12 is a perspective view of the three collet chuck 26 as assembled for use. Each of the collet jaws 22, 23, and 24 is made of suitable metallic material such as, for example, aluminum. Beginning at the ends of jaw 22 are tapered portions 21 and 27, discussed hereinabove, which are joined by a constant diameter portion 52. A circumferential groove 53 is formed approximately at the midpoint of the length of jaw 22. In addition, jaw 22 has four holes 54 bored therein, as shown in FIGS. 10 and 11 for containing small coil springs 56, as best seen in FIG. 12. The collet chuck 26 is shown assembled in FIG. 12. As can be seen, the assembled comprises the collet jaws 22, 23, and 24, separated from each other by the coil springs 56, and held together by a circumferential coil spring 57. As assembled, the jaws form a central gripping bore 58 which is adjustable, as explained hereinbefore, for gripping tube 34. A starter tube has a materially different diameter from an exhaust tube, both of which are usable with the present invention, hence the fully open diameter of central gripping bore 58 may be made larger or smaller by the length of the radius of the interior arc wall 59. In addition, it be appreciated that the collet chuck 26 is not necessarily limited to clamping round shapes such as the glass tubes, as they may be adapted to clamp other shapes by modification of the interior wall 59 of each collet jaw to mate with the object to be clamped.

Figure 13:
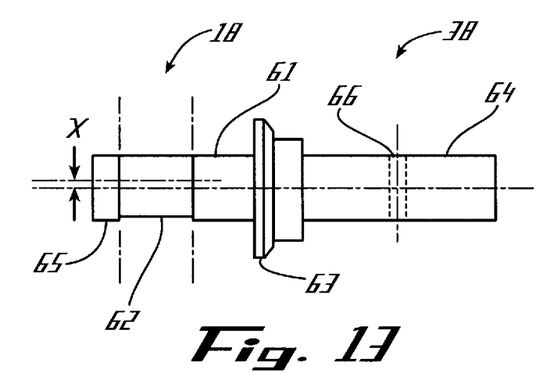
FIG. 13 is a side view of the locking or actuating pin of the present invention.
Figure 14:
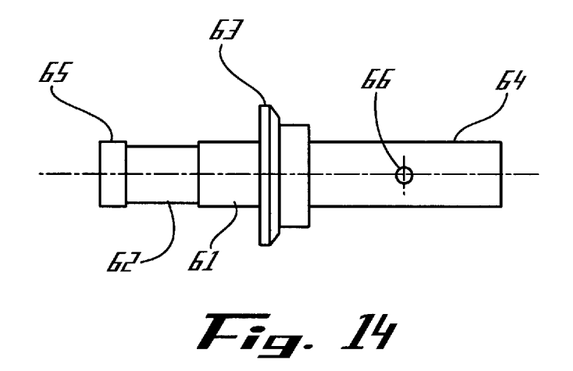
FIG. 14 is a view, rotated 90°, of the pin of FIG. 13.
Figure 15:
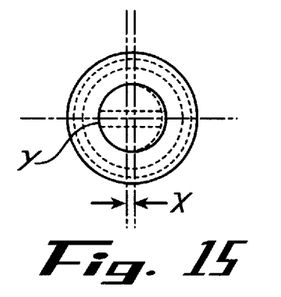
FIG. 15 is a front elevation view of the pin of FIGS. 13 and 14.

FIGS. 13, 14, and 15 are three views of the locking or actuating pin 38 which fits into the bore 46 and extends across channel 18 into bushing 45. The interior portion 61 of the pin 18, i.e., the portion that is inserted into bushing 45 in base member 12 has a first diameter which, in turn, has a ground portion 62 of slightly smaller diameter, e.g., approximately 0.015 inches smaller, which is tangent to the first diameter at a point Y, as best seen in FIG. 15. As a consequence, portion 62 has a centerline that is offset from the centerline of portion 61 a distance X, e.g., 0.0075 inches. Thus, portion 62, which spans channel 18, is an eccentric cam relative to portion 61 and to pin 38. A locating shoulder 63 is adapted to bear against one of the outer surfaces of the triangular portion of base member 12 to locate eccentric portion 62 in channel 18. Extending from shoulder 63 is a shaft 64 having a bore 66 therein for pinning an actuating arm 39 thereto. As best seen in FIG. 6, each of the walls of the triangular block 42 has a detent 67 therein and each actuating arm 39 has a spherical member 68 adapted to seat in its corresponding detent 67. Thus, it is possible to locate pin 38 precisely as to its rotation, so that the tangent point Y bears against the detent groove 40 in the resilient beam member 37 within channel 18 when the actuating arm 39 is rotated to the detent position. The first diameter, i.e., the principle diameter of the pin 38 is, for example, approximately 0.2500 inches, and that of eccentric section 62 approximately 0.2350 inches. It is to be understood that the dimensions given herein are by way of example, and that other dimensions might readily be usable. The pin 38 is prevented from flexing by end portion 65 in bearing bore 45 in the inner wall of channel 18.

Figure 16:
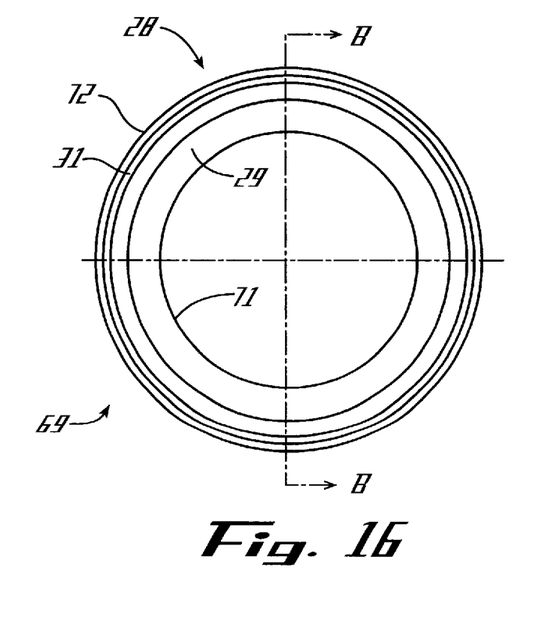
FIG. 16 is a plan view of the axial free play nut of the invention.
Figure 17:
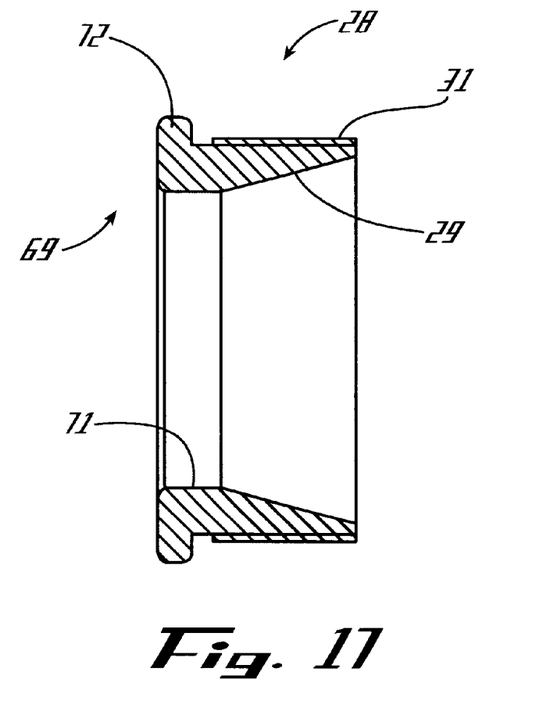
FIG. 17 is a cross-sectional view along the line B—B of FIG. 16.

The axial free play nut 28 is shown in FIGS. 16 and 17, and comprises a cylindrical body 69 of suitable metallic material, such as aluminum, having a bore 71 which has a tapered portion 29. Body 69 has exterior threads 31 which are adapted to mate with threads 32 of bayonet cylinder 19. At one end of body 69 is an enlarged diameter flange member 72 which affords a gripping means for the operator to screw nut 28 into the bayonet cylinder 19.

Operation

The compliant chuck 11 of the invention is assembled as shown in FIGS. 1, 2, and 3, and mounted on the spindle or face plate 16 of the lathe. The pins 38 enter into slots 36 through openings 51 and then bayonet cylinder 19 is turned to place the pins 38 into engagement with detents 40, thereby locking bayonet cylinder 19 in place. A glass tube 34 or other work piece is inserted into the three jawed collet chuck 26 and the operator then screws the axial free play nut 28 into bayonet cylinder 19, thus axially moving collet 26 by pressure brought to bear on taper or ramp 27 on the collet chuck 26 by tapered portion or ramp 29 of nut 28. The force exerted on chuck 26 by nut 28 has an axial component and a radial component, with the axial component forcing taper or ramp 21 on the chuck 26 against the taper or ramp 20 of base member 12. This, in turn, applies a radial force to the collet chuck 26 which is substantially the same as that applied by nut 28, bringing the jaws of the collet chuck 26 into gripping engagement with the work piece 34. Thus the axial movement of nut 28 is converted into radial movement of the jaws of the collet chuck 26.

The operator continues to rotate nut 28 until any free play or slack is removed and, to a first approximation, the tube or work piece 34 is gripped by the chuck 26. It is difficult for the operator to thus generate any additional radial force, which might damage the tube 34, however, the tube 34 is generally not sufficiently gripped to withstand the various forces encountered during operation. In order to apply sufficient force to grip the tube 34 firmly against such various forces, the locking or actuating pins 38, which, initially are in a non-actuating rotational position, i.e., the centerline of eccentric portion 62 of the pin 38 being farther from the bottom of the bare member than the centerline of the pin 38 itself, are then rotated to their detent positions as shown in FIG. 1 so that tangent point Y of each pin bears against its corresponding detent groove 40 and, as a consequence, flexes beam member 37. The eccentric profile of the shaft slides in the bayonet slot 36, pulling the bayonet cylinder 19 axially toward the base while generating a resisting load to this motion by allowing the beam members to deflect. This deflection of the beam member causes reaction forces to build up throughout the entire chuck assembly which include radial compressive forces on the tube 34 through the tapers. Alignment is achieved by the components involved reaching their equilibrium load and position, and the tube or workpiece 34 is firmly clamped. The per-established clamping force is uniform and can not be changed by the operator as long as the cams are moved to near identical positions during cam rotation. The detents for the actuating arms ensure this virtual identity of position and force. Instead of the detent arrangement, it is possible to use stops or set points for the pin rotation.

Figure 18:
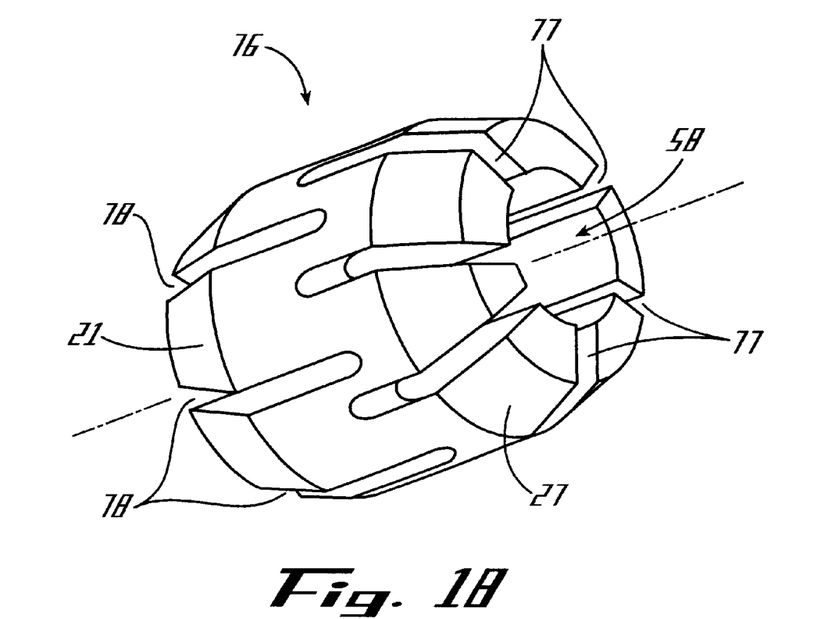
FIG. 18 is a perspective view of an alternative collet-type chuck for use with the invention.

As depicted in FIG. 12, the collet chuck 26 comprises three independent jaws 22, 23, and 24, separated by springs 56 and held together by a circumferential spring 57. It is, of course, possible to have more or less than three jaws, although the three jaw configuration provides both excellent gripping action and alignment. On the other hand, chuck 26 comprises several parts which can be misplaced or lost, and which present a tedious assembly operation. In FIG. 18 there is shown an alternative collet chuck 76 which is a unitary structure of substantially identical shape as the chuck of FIG. 12. However, instead of separate jaws and springs, chuck 76 has a plurality of longitudinal slots 77 extending from one end of the chuck 76 and interdigitated with longitudinal slots 78 extending from the other end of chuck 76. The slots 77 and 78 allow the gripping bore 58 to be compressed by the flexing of the chuck 76 by the same action as described with respect to FIG. 12 involving the tapers 21 and 27. The degree of flexibility imparted to the chuck 76 is determined by the number of slots, thus affording an additional measure of control of the gripping action of the chuck.

It is to be understood that the various features of the present invention are susceptible to inclusion in any of a number of possible embodiments, and that various modifications or adaptations of the principles herein disclosed might occur to workers in the art. All such embodiments, variations, or adaptations are intended to be included herein as being within the scope of the present invention as herein set forth. Further, in the claims hereinafter, the corresponding structures, materials, acts, and equivalents of all means or step plus function elements are intended to include any structure, material, or acts for performing the functions in combination with other elements as specifically claimed.

What is claimed is:

1. A compliant collet chuck comprising:
    a base member having a central bore extending therethrough and having at least one exterior side wall, said bore having a first tapered cone section therein;
    a channel in said base member surrounding said bore;
    an adjustable collet chuck having a first tapered portion at one end thereof adapted to bear against said first tapered cone section, said collet chuck having a central adjustable opening for containing and gripping a workpiece, and a second tapered portion at the other end thereof;
    a bayonet cylinder having a central axis and a first end in said channel, said first end having at least one bayonet slot therein forming a resilient beam, and a second end;
    a nut having a bore therein having a second tapered cone adapted to bear against the second tapered portion of said collet chuck member, said nut being axially movable against said collet chuck to apply a radial force thereto for gripping a workpiece; and
    at least one locking pin extending into said slot within said channel to bear against said resilient beam and to apply axial pressure thereto when said pin is rotated.

2. A compliant collet chuck as claimed in claim 1 wherein said nut is mounted to said second end of said bayonet cylinder and is axially movable with respect thereto.

3. A compliant collet chuck as claimed in claim 1 wherein said second end of said bayonet cylinder has internal threads and said nut has external threads adapted to mate with said internal threads to cause said nut to move axially with respect to said bayonet cylinder when said nut is rotated.

4. A compliant collet chuck as claimed in claim 1 wherein said at least one locking pin is rotatably mounted in said at least one side wall.

5. A compliant collet chuck as claimed in claim 4 wherein there is a plurality of locking pins rotatably mounted in said side wall, and a plurality of bayonet slots for receiving said pins.

6. A compliant collet chuck as claimed in claim 4 wherein said side wall has a detent formed therein and said locking pin has an actuating arm having a protrusion thereon adapted to rest in said detent when said locking pin is rotated to a predetermined actuating position.

7. A compliant collet chuck as claimed in claim 4 wherein said locking pin has an eccentric portion adapted to be contained in said bayonet slot.

8. A compliant collet chuck as claimed in claim 7 wherein said bayonet slot has a detent formed therein for containing said eccentric portion of said locking pin.

9. A compliant collet chuck as claimed in claim 8 wherein said locking pin has a first diameter and said eccentric portion has a second diameter different from said first diameter, said eccentric portion being tangent to said first diameter at a point.

10. A compliant collet chuck as claimed in claim 9 wherein said point bears against said detent to apply axial force to said beam when said pin is rotated to an actuating position.

11. A compliant collet chuck as claimed in claim 1 wherein said adjustable collet chuck has a plurality of jaws, each of said jaws being spaced from adjacent jaws by resilient members.

12. A compliant collet chuck as claimed in claim 11 wherein said resilient members are coil springs.

13. A compliant collet chuck as claimed in claim 11 wherein said jaws form an assembly having said adjustable opening.

14. A compliant collet chuck as claimed in claim 13 wherein there are three jaws.

15. A compliant collet chuck as claimed in claim 1 wherein said one end of said adjustable collet chuck has at least one first longitudinally extending slot and said other end has at least one second longitudinally extending slot, said first and second slots being offset from each other.

16. A compliant collet chuck as claimed in claim 15 wherein there is a plurality of slots extending longitudinally from each end of said adjustable collet chuck with the slots from said one end being interdigitated with respect to the slots from said other end.

17. A compliant collet chuck comprising:
- a base comprising a plate and having upstanding walls extending from said plate;
- a central axial bore in said base;
- a channel surrounding said central box containing a first end of a bayonet cylinder;
- an adjustable collet chuck having an adjustable opening for gripping a workpiece in said central bore;
- a nut for applying axial force to said adjustable collet chuck; and
- means for converting axial force to radial force comprising a first tapered portion in said axial bore and a second tapered portion in said nut, a third tapered portion on one end of said adjustable collet chuck adapted to bear against said first tapered portion and a fourth tapered portion on the other end of said adjustable collet chuck adapted to bear against said second tapered portion whereby said adjustable opening is contracted to grip the workpiece.

18. A compliant collet chuck as claimed in claim 17 wherein said first end of said bayonet cylinder has a plurality of circumferentially extending bayonet slots therein forming resilient beams, and rotatable eccentric members are contained in said slots for applying an axial force to said bayonet cylinder upon rotation of said eccentric members.

19. A method of gripping a workpiece in a complaint collet chuck comprising the steps of:
- placing the workpiece in the adjustable opening of an adjustable collet chuck;
- applying an axial force to the adjustable collet chuck;
- converting the axial force to a radial force to decrease the size of the adjustable opening thereby to grip the workpiece; and
- applying an additional axial force to the adjustable collet chuck to lock the workpiece therein.

20. The method of gripping a workpiece as claimed in claim 19 and further comprising the step of applying the additional axial force to a resilient beam on a member of the collet chuck to which a means for applying the first axial force is attached.

* * * * *